(12) United States Patent
Rao et al.

(10) Patent No.: US 12,024,793 B2
(45) Date of Patent: Jul. 2, 2024

(54) HIGH REFRACTIVE INDEX ORGANIC SOLID CRYSTAL WITH CONTROLLED SURFACE ROUGHNESS

(71) Applicant: META PLATFORMS TECHNOLOGIES, LLC, Menlo Park, CA (US)

(72) Inventors: Tingling Rao, Bellevue, WA (US); Kimberly Kay Childress, Duvall, WA (US); Arman Boromand, Issaquah, WA (US); Lafe Joseph Purvis, II, Redmond, WA (US); Ehsan Vadiee, Redmond, WA (US); Namseok Park, Issaquah, WA (US); Andrew John Ouderkirk, Kirkland, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 227 days.

(21) Appl. No.: 17/676,940

(22) Filed: Feb. 22, 2022

(65) Prior Publication Data

US 2023/0037175 A1 Feb. 2, 2023

Related U.S. Application Data

(60) Provisional application No. 63/224,304, filed on Jul. 21, 2021.

(51) Int. Cl.
*C30B 29/64* (2006.01)
*C30B 19/10* (2006.01)
(Continued)

(52) U.S. Cl.
CPC ............ *C30B 29/54* (2013.01); *C30B 19/106* (2013.01); *C30B 29/64* (2013.01); *C30B 35/002* (2013.01)

(58) Field of Classification Search
CPC ....... C30B 29/54; C30B 29/64; C30B 19/106; C30B 35/002; B29C 33/58; B29C 33/60; B29C 33/62
See application file for complete search history.

(56) References Cited

U.S. PATENT DOCUMENTS 5,385,116 A * 1/1995 Hattori .................... C30B 29/58
117/5
2007/0237918 A1 10/2007 Jonza et al.

FOREIGN PATENT DOCUMENTS

JP 4906024 * 3/2012

OTHER PUBLICATIONS

International Search report and Written Opinion for International Application No. PCT/US2022/037686, dated Jan. 9, 2023, 11 pages.
(Continued)

*Primary Examiner* — Robert M Kunemund
(74) *Attorney, Agent, or Firm* — Greenberg Traurig, LLP

(57) ABSTRACT

An organic thin film includes an organic crystalline phase, where the organic crystalline phase defines a surface having a surface roughness ($R_a$) of less than approximately 10 micrometers over an area of at least approximately 1 cm². The organic thin film may be manufactured from an organic precursor and a non-volatile medium material that is configured to mediate the surface roughness of the organic crystalline phase during crystal nucleation and growth. The thin film may be formed using a suitably shaped mold, for example, and the non-volatile medium material may be disposed between a layer of the organic precursor and the mold during processing.

19 Claims, 11 Drawing Sheets

A

B

(51) Int. Cl.
*C30B 29/54* (2006.01)
*C30B 35/00* (2006.01)

(56) References Cited

OTHER PUBLICATIONS

Invitation to Pay Additional Fees for International Application No. PCT/US2022/037686, dated Nov. 11, 2022, 7 pages.

* cited by examiner

A

B

*A*

*B*

*A*

*B*

HIGH REFRACTIVE INDEX ORGANIC SOLID CRYSTAL WITH CONTROLLED SURFACE ROUGHNESS

CROSS-REFERENCE TO RELATED APPLICATION

This application claims the benefit of priority under 35 U.S.C. § 119(e) of U.S. Provisional Application No. 63/224,304, filed Jul. 21, 2021, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
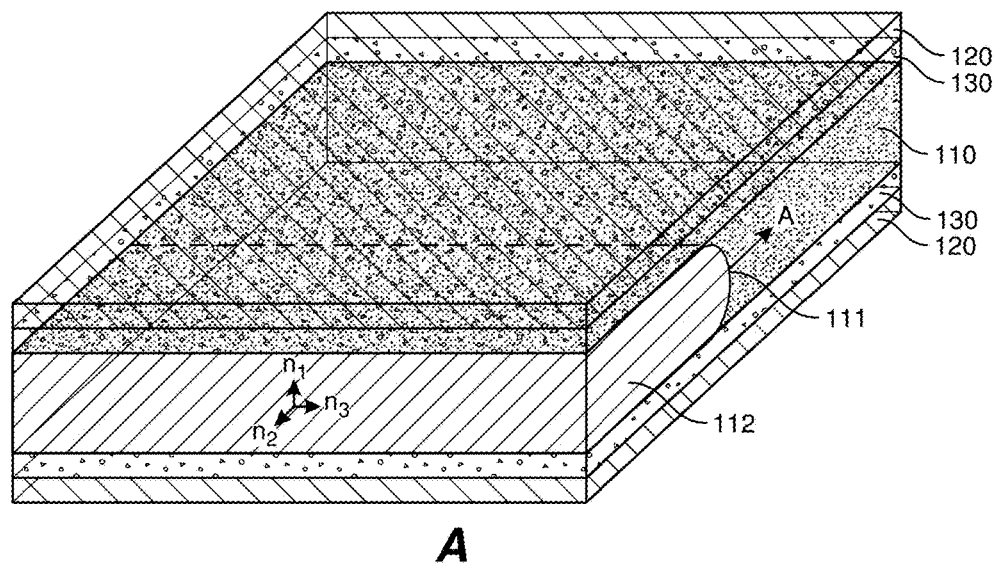
FIG. 1 illustrates example methods for manufacturing (A) a free-standing organic solid crystal thin film and (B) a supported organic solid crystal thin film according to various embodiments.
Figure 1:
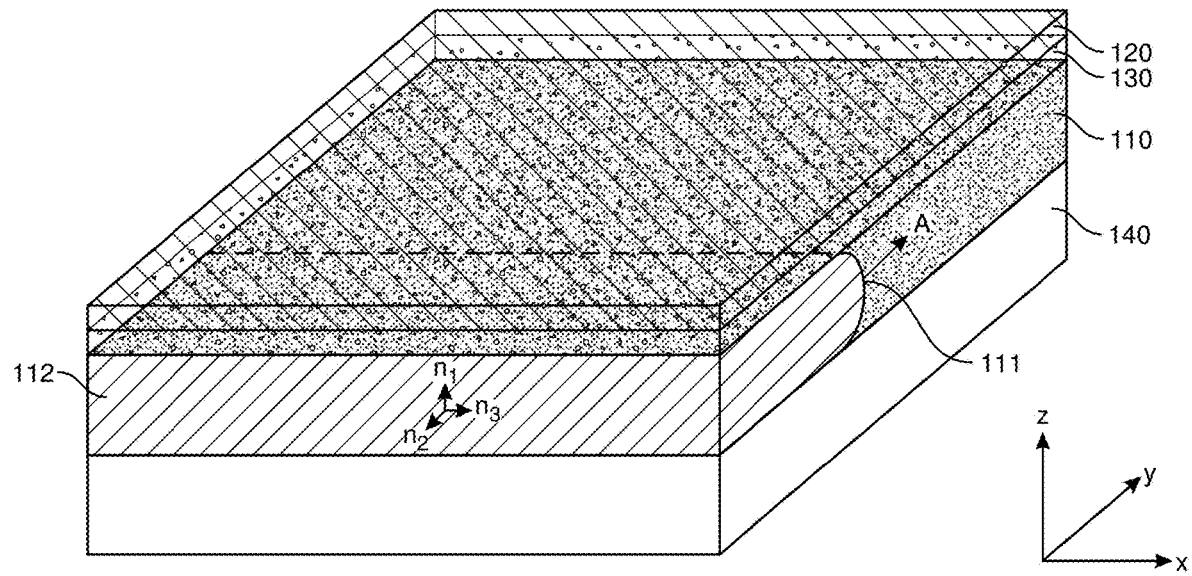

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to organic solid crystal materials and more specifically to thin film structures formed from such materials. Example organic solid crystal thin films may include an organic solid crystal phase having a high refractive index and high birefringence and that is further characterized by a smooth exterior surface. The disclosed organic solid crystal (OSC) materials may include various classes of organic semiconductors and may be incorporated into a variety of optical systems and devices.

In accordance with various embodiments, organic semiconductors may include small molecules, macromolecules, liquid crystals, organometallic compounds, oligomers, and polymers. Organic semiconductors may include p-type, n-type, or ambipolar polycyclic aromatic hydrocarbons, such as anthracene, phenanthrene, diphenylacetylene, stilbene, azobenzene, benzylideneaniline, terphenyl, biphenyl, thiophene, carbon 60, pyrene, corannulene, fluorene, etc.

Example compounds may include cyclic, linear and/or branched structures, which may be saturated or unsaturated, and may additionally include heteroatoms and saturated or unsaturated heterocycles, such as furan, pyrrole, thiophene, pyridine, pyrimidine, piperidine, and the like. Heteroatoms may include fluorine, chlorine, nitrogen, oxygen, sulfur, phosphorus, as well as various metals.

Structurally, the disclosed organic materials may be glassy, polycrystalline, or single crystal. Organic solid crystals, for instance, may include closely packed structures (e.g., organic molecules) that exhibit desirable optical properties such as a high and tunable refractive index, and high birefringence. Such materials may provide functionalities, including phase modulation, beam steering, wave-front shaping and correction, optical communication, optical computation, holography, etc. Due to their optical and mechanical properties, organic solid crystals may enable high-performance devices, and may be incorporated into passive or active optics, including AR/VR headsets, and may replace comparative material systems such as polymers, inorganic materials, and liquid crystals. In certain aspects, organic solid crystals may have optical properties that rival those of inorganic crystals while exhibiting the processability and electrical response of liquid crystals.

According to some embodiments, one or more organic solid crystal material layers may be used to form a variety of device architectures, including transistors, diodes, capacitors, etc. Example transistor architectures may include MOSFET, JFET, ESFET, HEMT, BJT, etc. In certain embodiments, a transistor architecture may include an OFET, which may have a geometry selected from TGTC, BGTC, TGBC, and BGBC. Example diodes may include p-n junction, Schottky, avalanche, and PIN geometries. Example capacitors may include a parallel plate geometry. In a multilayer architecture, the composition, structure, and properties of each organic solid crystal layer may be independently selected.

Due to their relatively low melting temperature, organic solid crystals may be molded to form a desired structure. Molding processes may enable complex architectures and may be more economical than the cutting, grinding, and polishing of bulk crystals. In addition, as disclosed further herein, a chemical additive may be integrated with a molding process to improve the surface roughness of a molded organic solid crystal in situ. The chemical additive may include a liquid non-volatile medium, such as an oil. In some embodiments, a single crystal or polycrystalline basic shape such as a sheet or cube may be partially or fully melted into a desired form and then controllably cooled to form a single crystal having a new shape. Suitable feedstock for molding solid organic semiconductor materials may include neat organic compositions, melts, solutions, or suspensions of one or more suitable organic molecules.

High refractive index and highly birefringent organic semiconductor materials may be manufactured as a free-standing thin film or as a thin film deposited onto a substrate. An epitaxial or non-epitaxial growth process, for example, may be used to form an organic solid crystal (OSC) layer over a suitable substrate or mold. A seed layer for encouraging crystal nucleation and an anti-nucleation layer configured to locally inhibit nucleation may individually or collectively promote the formation of a limited number of crystal nuclei within specified locations, which may in turn encourage the formation of larger organic solid crystals. In some embodiments, a nucleation-promoting layer or seed layer may be configured as a thin film.

Example nucleation-promoting or seed layer materials may include one or more metallic or inorganic elements or compounds, such as Pt, Ag, Au, Al, Pb, indium tin oxide, $SiO_2$, and the like. Further example nucleation-promoting or seed layer materials may include organic compounds, such as a polyimide, polyamide, polyurethane, polyurea, polythiolurethane, polyethylene, polysulfonate, polyolefin, as well as mixtures and combinations thereof. In some examples, a nucleation-promoting material may be configured as a textured or aligned layer, such as a rubbed polyimide or photoalignment layer, which may be configured to induce directionality or a preferred orientation to an over-formed organic solid crystal thin film.

An anti-nucleation layer may include a dielectric material. In further embodiments, an anti-nucleation layer may include an amorphous material. In example processes, crystal nucleation may occur independent of a substrate or mold.

In some embodiments, a surface treatment or a release layer disposed over the substrate or mold may be used to control nucleation and growth of the organic solid crystal (OSC) and later promote separation and harvesting of a bulk crystal or thin film. For instance, a coating having a solubility parameter mismatch with the deposition chemistry may be applied to the substrate (e.g., locally) to suppress interaction between the substrate and the crystallizing layer during the deposition process. Examples of such coatings may include oleophobic coatings or hydrophobic coatings. A thin layer, e.g., monolayer or bilayer, of an oleophobic material or a hydrophobic material may be used to condition the substrate or mold prior to an epitaxial process. The coating material may be selected based on the substrate and/or the crystalline material. Further example coating materials include siloxanes, fluorosiloxanes, phenyl siloxanes, fluorinated coatings, polyvinyl alcohol, and other OH bearing coatings, acrylics, polyurethanes, polyesters, polyimides, and the like.

A buffer layer may be formed over the deposition surface of a substrate or mold. A buffer layer may include a small molecule that is similar to or even equivalent to the small molecule making up the organic solid crystal, e.g., an anthracene single crystal. A buffer layer may be used to tune one or more properties of the growth surface of the substrate or mold, including surface energy, wettability, crystalline or molecular orientation, etc.

A variety of methods may be used to form an organic solid crystal thin film. An example method may include contacting an organic precursor with a liquid non-volatile medium material, forming a layer comprising the organic precursor within a mold, and processing the organic precursor to form an organic crystalline phase. The organic crystalline phase may define a surface of an organic thin film having a surface roughness ($R_a$) of less than approximately 10 micrometers over an area of at least approximately 1 $cm^2$.

The non-volatile medium material may be disposed between the mold surface and the organic precursor and may be configured to decrease the surface roughness of the molded organic solid crystal thin film and promote its release from the mold. Example non-volatile medium materials include liquids such as silicone oil, a fluorinated polymer, a polyolefin and/or polyethylene glycol. Further example non-volatile medium materials may include crystalline materials having a melting temperature that is less than the melting temperature of the organic precursor material. Still further example non-volatile medium materials may include crystalline materials having a melting temperature that is at least approximately 10° C. different than a melting temperature of the organic precursor material. In some embodiments the mold surface may be pre-treated in order to improve wetting and/or adhesion of the non-volatile medium material.

The act of contacting the organic precursor with the non-volatile medium material may include forming a homogeneous mixture of the organic precursor and the non-volatile medium material. In further embodiments, the act of contacting the organic precursor with the non-volatile medium material may include forming a layer of the non-volatile medium material over a surface of a substrate or mold and forming a layer of the organic precursor over the layer of the non-volatile medium material.

A further example method of manufacturing an organic solid crystal thin film may include providing a substrate, forming a layer of a nucleation-promoting material over at least a portion of a surface of the substrate, and depositing a layer of molten feedstock over the surface of the substrate and in contact with the layer of the nucleation-promoting material, while maintaining a temperature gradient across the layer of the molten feedstock.

Further example deposition methods for forming organic solid crystals include vapor phase growth, solid state growth, melt-based growth, solution growth, etc., optionally in conjunction with a suitable substrate. A substrate may be organic or inorganic. According to some embodiments, solid-, liquid-, or gas-phase deposition processes may include epitaxial processes.

As used herein, the terms "epitaxy," "epitaxial" and/or "epitaxial growth and/or deposition" refer to the nucleation and growth of an organic solid crystal on a deposition surface where the organic solid crystal layer being grown assumes the same crystalline habit as the material of the deposition surface. For example, in an epitaxial deposition process, chemical reactants may be controlled, and the system parameters may be set so that depositing atoms or molecules alight on the deposition surface and remain sufficiently mobile via surface diffusion to orient themselves according to the crystalline orientation of the atoms or molecules of the deposition surface. An epitaxial process may be homogeneous or heterogeneous.

During an example method, to promote nucleation and crystal growth, a selected temperature and temperature gradient may be applied to a crystallization front of the nascent thin film. For instance, the temperature and temperature gradient proximate to the crystallization front may be determined based on the selected feedstock, including its melting temperature, thermal stability, and rheological attributes.

The substrate or mold may include a surface that may be configured to provide a desired shape to the molded organic solid crystal thin film. For example, the substrate or mold surface may be planar, concave, or convex, and may include a three-dimensional architecture, such as surface relief gratings, or a curvature configured to form microlenses, microprisms, or prismatic lenses. That is, according to some embodiments, a substrate or mold geometry may be transferred and incorporated into a surface of an over-formed organic solid crystal thin film.

The deposition surface of a substrate or mold may include a functional layer that is adapted to be transferred to the organic solid crystal after formation of the organic solid crystal and its separation from the substrate or mold. Functional layers may include an interference coating, an AR coating, a reflectivity enhancing coating, a bandpass coating, a band-block coating, blanket or patterned electrodes, etc. By way of example, an electrode may include any suitably electrically conductive material such as a metal, a transparent conductive oxide (TCO) (e.g., indium tin oxide or indium gallium zinc oxide), or a metal mesh or nanowire matrix (e.g., including metal nanowires or carbon nanotubes).

For the sake of convenience, the terms "substrate" and "mold" may be used interchangeably herein unless the context indicates otherwise. In some embodiments, a non-volatile medium material may be disposed between the mold surface and the organic precursor and may be adapted to decrease the surface roughness of the molded organic solid crystal and promote its release from the mold while locally promoting or inhibiting nucleation of a crystalline phase.

The substrate or mold may include any suitable material, e.g., silicon, silicon dioxide, fused silica, quartz, glass, nickel, silicones, siloxanes, perfluoropolyethers, polytetrafluoroethylenes, perfluoroalkoxy alkanes, polyimide, polyethylene naphthalate, polyvinylidene fluoride, polyphenylene sulfide, and the like.

In accordance with various embodiments, the optical and electrooptical properties of an organic solid crystal may be tuned using doping and related techniques. Doping may influence the polarizability of an organic solid crystal thin film, for example. The introduction of dopants, i.e., impurities, into an organic solid crystal, may influence, for example, the highest occupied molecular orbital (HOMO) and lowest unoccupied molecular orbital (LUMO) bands and hence the band gap of the OSC material, its induced dipole moment, and/or its molecular/crystal polarizability.

Doping may be performed in situ, i.e., during epitaxial growth, or following epitaxial growth, for example, using ion implantation or plasma doping. In exemplary embodiments, doping may be used to modify the electronic structure of an organic solid crystal without damaging molecular packing or the crystal structure itself. In this vein, a post-implantation annealing step may be used to heal crystal defects introduced during ion implantation. Annealing may include rapid thermal annealing or pulsed annealing, for example.

Doping changes the electron and hole carrier concentrations of a host material at thermal equilibrium. A doped organic solid crystal may be p-type or n-type. As used herein, "p-type" refers to the addition of impurities to an organic solid crystal that create a deficiency of valence electrons, whereas "n-type" refers to the addition of impurities that contribute free electrons to an organic solid crystal. Without wishing to be bound by theory, doping may influence "π-stacking" and "π-π interactions" within an organic solid crystal.

Example dopants include Lewis acids (electron acceptors) and Lewis bases (electron donors). Particular examples include charge-neutral and ionic species, e.g., Brønsted acids and Brønsted bases, which in addition to the aforementioned processes may be incorporated into an organic solid crystal by solution growth or co-deposition from the vapor phase. In particular embodiments, a dopant may include an organic molecule, an organic ion, an inorganic molecule, or an inorganic ion. A doping profile may be homogeneous or localized to a particular region (e.g., depth) of an organic solid crystal thin film.

Following deposition, an OSC thin film may be diced and polished to achieve a desired form factor and surface quality. Dicing may include diamond turning, for example, although other cutting methods may be used. Polishing may include chemical mechanical polishing. In some embodiments, a chemical or mechanical surface treatment may be used to create structures on a surface of an OSC thin film. Example surface treatment methods include diamond turning and photolithography/etch processes. In some embodiments, a cover plate or substrate with reciprocal structures may be used to fabricate surface structures of an OSC thin film, e.g., during zone annealing.

An organic solid crystal thin film may include an organic crystalline phase. The organic crystalline phase may be single crystal or polycrystalline. In some embodiments, the organic crystalline phase may include amorphous regions. In some embodiments, the organic crystalline phase may be substantially crystalline. A crystalline phase may constitute at least approximately 80% of an organic solid crystal thin film, e.g., at least approximately 80%, at least approximately 85%, at least approximately 90%, or at least approximately 95%, including ranges between any of the foregoing values.

The organic crystalline phase may be characterized by a refractive index along at least one principal axis of at least approximately 1.5 at 589 nm, and may be optically isotropic or anisotropic. By way of example, the refractive index of the organic crystalline phase at 589 nm and along at least one principal axis (e.g., both in-plane principal axes of an organic solid crystal thin film) may be at least approximately 1.5, at least approximately 1.6, at least approximately 1.7, at least approximately 1.8, at least approximately 1.9, at least approximately 2.0, at least approximately 2.1, at least approximately 2.2, at least approximately 2.3, at least approximately 2.4, at least approximately 2.5, or at least approximately 2.6, including ranges between any of the foregoing values.

In some embodiments, the organic crystalline phase may be isotropic ($n_1=n_2=n_3$) or anisotropic ($n_1 \neq n_2 \neq n_3$ or $n_1 \neq n_2 = n_3$ or $n_1 = n_2 \neq n_3$) and thus may be characterized by a birefringence ($\Delta n$) of at least approximately 0.2, e.g., at least approximately 0.2, at least approximately 0.3, at least approximately 0.4, or at least approximately 0.5, including ranges between any of the foregoing values. In some embodiments, a birefringent organic crystalline phase may be characterized by a birefringence of less than approximately 0.2, e.g., less than approximately 0.2, less than approximately 0.1, less than approximately 0.05, less than approximately 0.02, less than approximately 0.01, less than approximately 0.005, less than approximately 0.002, or less than approximately 0.001, including ranges between any of the foregoing values. In particular embodiments, an OSC thin film may be characterized by an in-plane refractive index of at least approximately 1.8 across the visible spectrum, and an in-plane birefringence of at least approximately 0.2.

Three axis ellipsometry data for example isotropic or anisotropic organic molecules are shown in Table 1. The data include predicted and measured refractive index values and birefringence values for 1,2,3-trichlorobenzene (1,2,3-TCB), 1,2-diphenylethyne (1,2-DPE), and phenazine. Shown are larger than anticipated refractive index values and birefringence compared to calculated values based on the HOMO-LUMO gap for each organic material composition.

TABLE 1

Index and Birefringence Data for Example Organic Semiconductors

| Organic Material | Predicted Index | Measured Index (589 nm) | | | Birefringence | | |
|---|---|---|---|---|---|---|---|
| | | nx | ny | nz | $\Delta n(xy)$ | $\Delta n(xz)$ | $\Delta n(yz)$ |
| 1,2,3-TCB | 1.567 | 1.67 | 1.76 | 1.85 | 0.09 | 0.18 | 0.09 |
| 1,2-DPE | 1.623 | 1.62 | 1.83 | 1.63 | 0.18 | 0.01 | 0.17 |
| phenazine | 1.74 | 1.76 | 1.84 | 1.97 | 0.08 | 0.21 | 0.13 |

In some embodiments, the organic crystalline phase may define a surface of a thin film having a surface roughness ($R_a$) of less than approximately 10 micrometers over an area of at least approximately 1 cm². In some embodiments, at least one surface of the organic thin film may have a surface roughness ($R_a$) of less than approximately 10000 nm, less than approximately 5000 nm, less than approximately 2000 nm, less than approximately 1000 nm, less than approximately 500 nm, less than approximately 200 nm, less than approximately 100 nm, less than approximately 50 nm, less than approximately 20 nm, less than approximately 10 nm, less than approximately 5 nm, less than approximately 2 nm, or less than approximately 1 nm, including ranges between any of the foregoing values. Surface roughness may be measured by scanning electron microscopy (SEM), atomic force microscopy (AFM), or using a suitable optical metrology platform, such as a 3D optical profilometer.

An organic thin film may be configured in a variety of shapes and/or form factors. An organic thin film may include a surface that is planar, convex, or concave. In some embodiments, the surface may include a three-dimensional architecture, such as a periodic surface relief grating. In further embodiments, a thin film may be configured as a microlens or a prismatic lens. For instance, polarization optics may include a microlens that selectively focuses one polarization of light over another.

In some embodiments, a structured surface may be formed in situ, i.e., during crystal growth of the organic solid crystal. In further embodiments, a structured surface may be formed after crystal growth, e.g., using additive or subtractive processing, such as photolithography and etching. A thin film or bulk crystal of an organic semiconductor may be free-standing or disposed over a substrate. A substrate, if used, may be rigid or deformable. The nucleation and growth kinetics and choice of chemistry may be selected to produce a solid organic crystal thin film having areal (lateral) dimensions of at least approximately 1 cm.

According to some embodiments, the disclosed organic solid crystals may have an actively tunable refractive index and birefringence. Applicants have shown that through the application of an electric current and/or voltage, the refractive index of various organic compositions can be tuned to a commercially-relevant degree in a highly controlled fashion.

Methods of manufacturing organic solid crystals may enable control of their surface roughness independent of surface features (e.g., gratings, etc.) and may include the formation of an organic article therefrom. According to various embodiments, an organic solid crystal thin film may be integrated into an optical component or device, such as an OFET, OPV, OLED, etc., and may be incorporated into an optical element such as a waveguide, Fresnel lens (e.g., a cylindrical Fresnel lens or a spherical Fresnel lens), grating, photonic integrated circuit, birefringent compensation layer, reflective polarizer, index matching layer (LED/OLED), and the like. In certain embodiments, grating architectures may be tunable along one, two, or three principal axes. Optical elements may include a single layer or a multilayer OSC architecture.

As will be appreciated, one or more characteristics of organic solid crystals may be specifically tailored for a particular application. For many optical applications, for instance, it may be advantageous to control crystallite size, surface roughness, mechanical strength and toughness, and the orientation of crystallites and/or molecules within an organic solid crystal thin film.

The active modulation of refractive index may improve the performance of photonic systems and devices, including passive and active optical waveguides, resonators, lasers, optical modulators, etc. Further example active optics include projectors and projection optics, ophthalmic high index lenses, eye-tracking, gradient-index optics, Pancharatnam-Berry phase (PBP) lenses, microlenses, pupil steering elements, optical computing, fiber optics, rewritable optical data storage, all-optical logic gates, multi-wavelength optical data processing, optical transistors, etc.

According to further embodiments, organic solid crystals (e.g., OSC thin films) may be incorporated into passive optics, such as waveguides, reflective polarizers, refractive/diffractive lenses, and the like. Related optical elements for passive optics may include waveguides, polarization selective gratings, Fresnel lenses, microlenses, geometric lenses, PBP lenses, and multilayer thin films.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-9, detailed descriptions of organic solid crystal thin films and their methods of manufacture. The discussion associated with FIGS. 1 and 2 includes a description of example manufacturing methods for forming organic solid crystals.

The discussion associated with FIGS. 3-7 relates to the structure and properties of example organic solid crystals. The discussion associated with FIGS. 8 and 9 relates to exemplary virtual reality and augmented reality devices that may include one or more organic solid crystal thin films as disclosed herein.

Turning to FIG. 1, shown schematically are example manufacturing architectures that may be implemented in accordance with certain methods of forming an organic solid crystal thin film. In some embodiments, a layer of a crystallizable organic precursor 110 may be deposited over a surface of a mold 120 or between mold surfaces and processed to form an organic solid crystal thin film 112. The crystallizable organic precursor may include one or more crystallizable organic molecules.

Referring to FIG. 1A, shown at an intermediate stage of fabrication, the organic precursor layer 110 may be disposed between upper and lower mold bodies 120, which may be respectively coated with upper and lower layers of a non-volatile medium material 130. The non-volatile medium material layer 130 may include an anti-nucleation layer. Following processing to induce nucleation and growth of the organic solid crystal, the resulting organic solid crystal thin film 112 may be removed from the mold 120. Exemplary processing steps may include zone annealing. The organic solid thin film 112 may be birefringent (e.g., $n_1 \neq n_2 \neq n_3$) and may be characterized by a high refractive index (e.g., $n_2>1.5$ and/or $n_3>1.5$).

Figure 2:
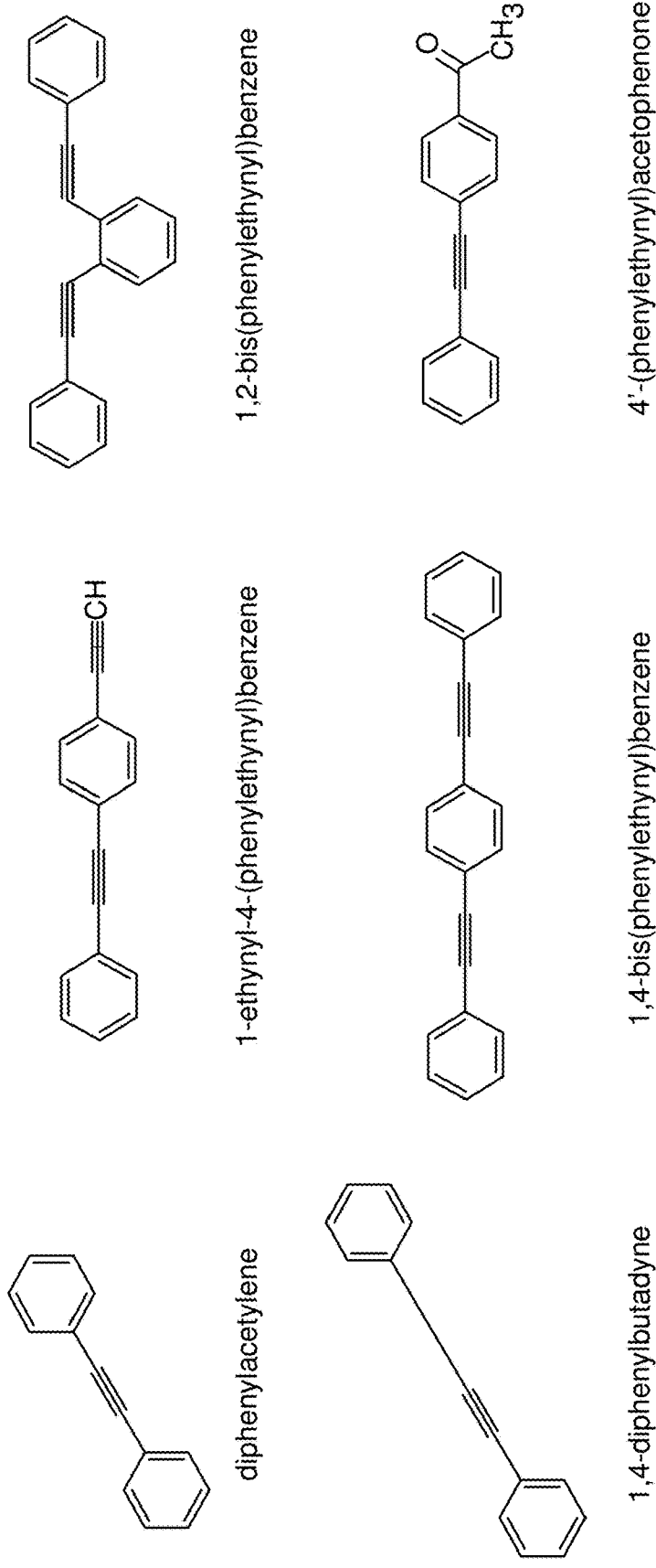
FIG. 2 shows example crystallizable organic molecules suitable for forming organic solid crystal thin films according to certain embodiments.
Figure 2:
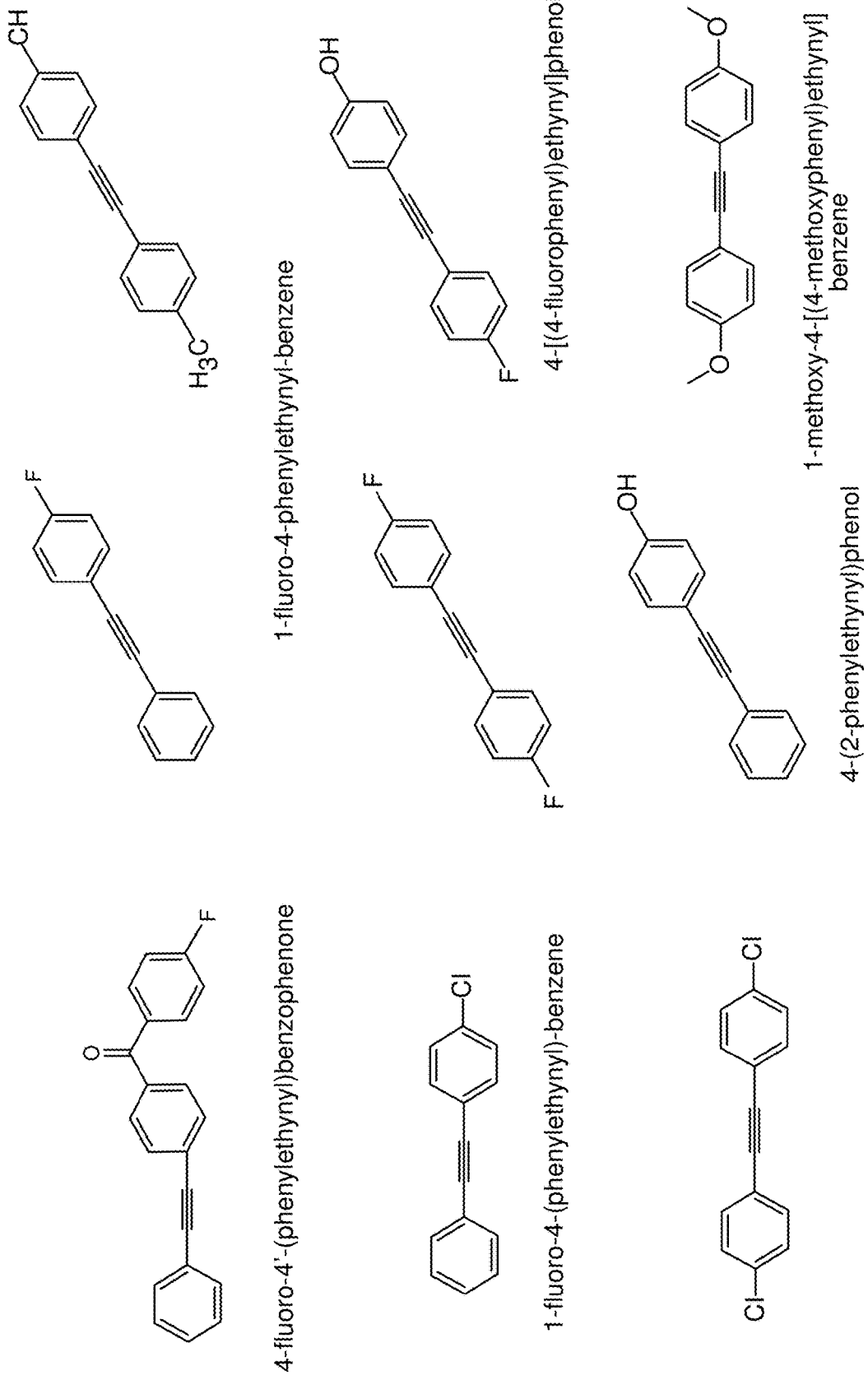
Figure 2:
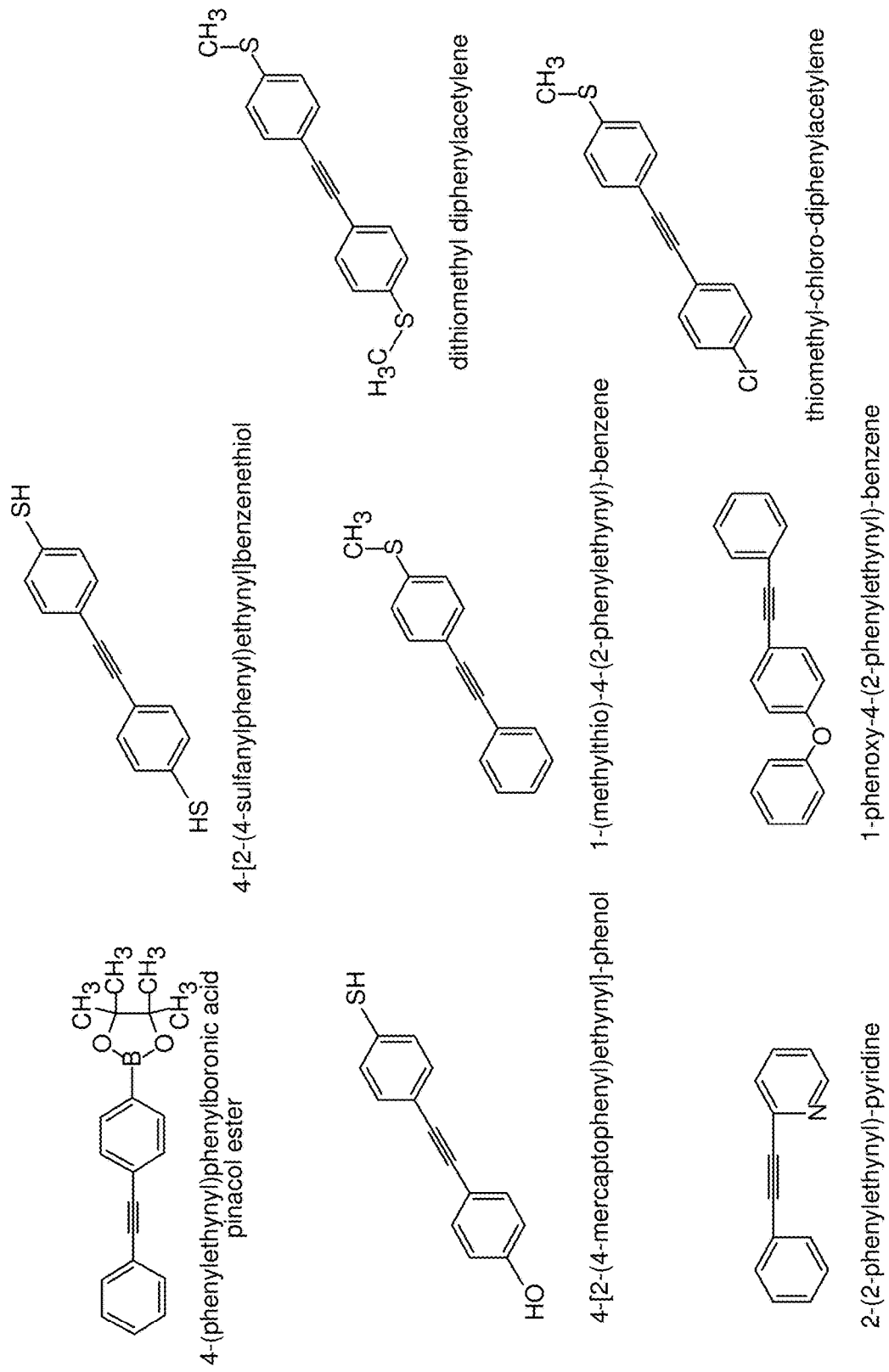

Referring to FIG. 1B, shown is a further manufacturing architecture for forming a supported organic solid crystal thin film. In the architecture of FIG. 1B, at an intermediate stage of fabrication, a crystallizable organic precursor layer 110 may be disposed over a substrate 140. An upper mold body 120 may overlie the organic precursor layer 110, and a non-volatile medium material layer 130 may be located between the mold 120 and the organic precursor layer 110. The layer of non-volatile medium material 130 may directly overlie the organic precursor layer 110 and may be configured to control the surface roughness of an upper surface of the organic solid crystal thin film 112 during crystal growth. In accordance with some embodiments, in FIG. 1A and FIG. 1B, the direction of movement of a crystallization front 111 during crystal growth is denoted with an arrow A. Example small molecules (e.g., organic precursors) that may be used to form an organic solid crystal thin film such as organic solid crystal thin film 112 are illustrated in FIG. 2.

Figure 3:
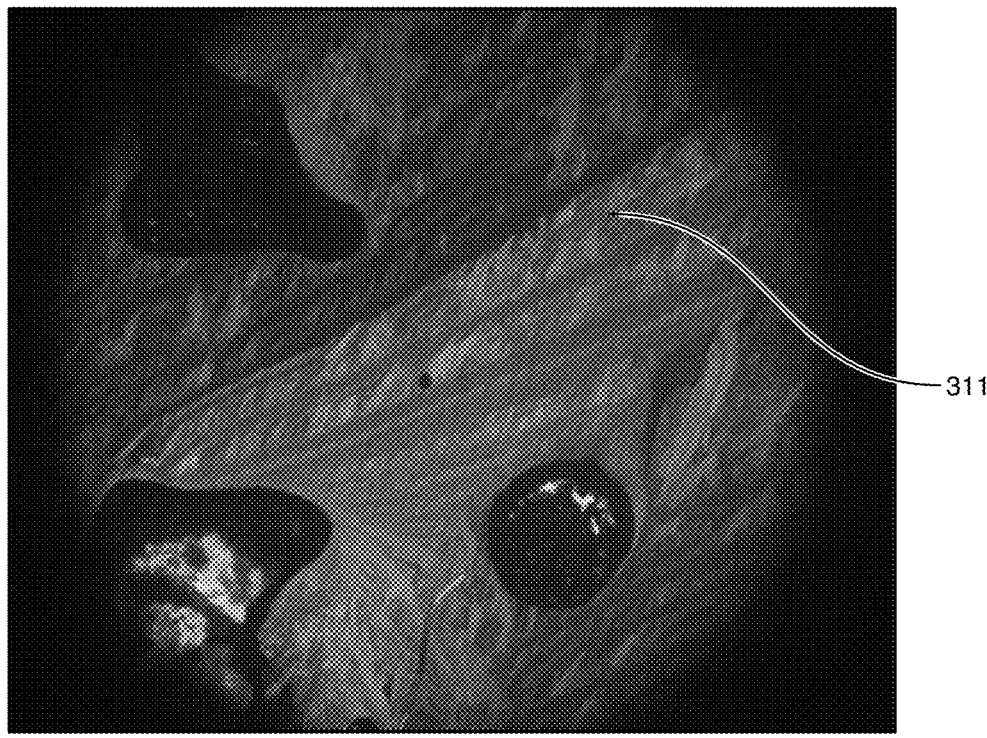
FIG. 3 shows cross-polarized microscope images of an organic solid crystal thin film manufactured (A) without a layer of non-volatile medium material disposed between a layer of an organic precursor and a substrate and (B) with a layer of non-volatile medium material disposed between a layer of an organic precursor and a substrate according to some embodiments.
Figure 3:
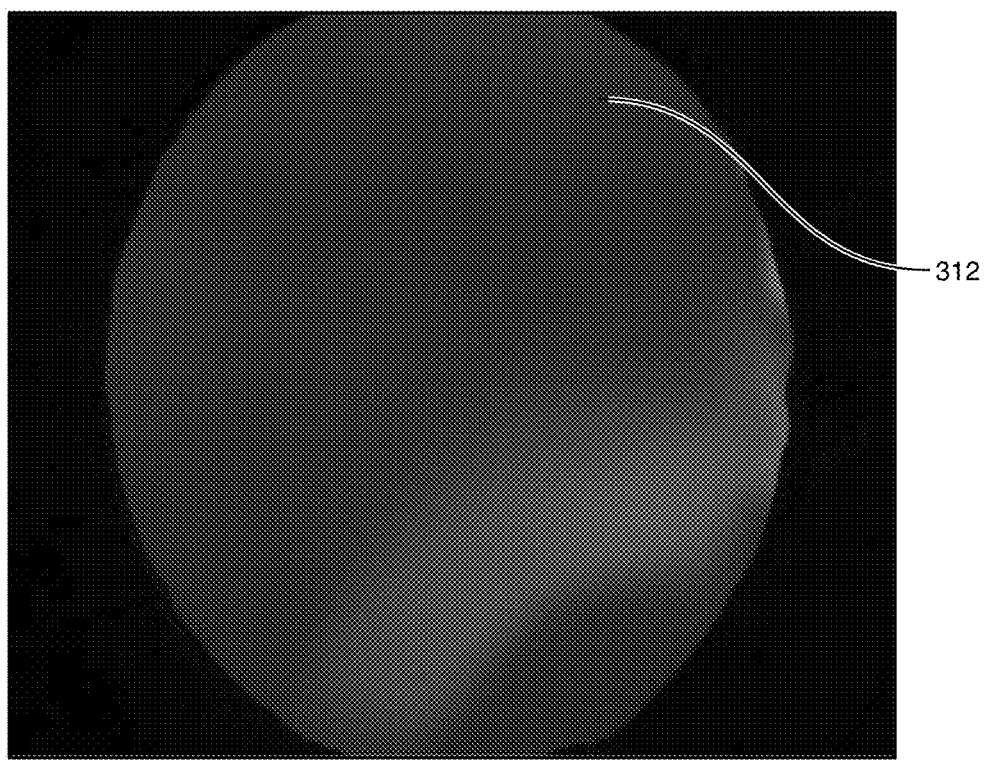

Referring to FIG. 3, shown are polarized optical microscope images of organic solid crystal thin films formed using a mold-based method. The thin films 311, 312 were manufactured (A) without using a layer of non-volatile medium material, and (B) with a layer of non-volatile medium material pre-disposed over a surface of the mold (for example, using a method illustrated in FIG. 1A or FIG. 1B). The improved surface morphology associated with use of the non-volatile medium material layer is evident in the appearance of organic solid thin film 312 in FIG. 3B.

Figure 4:
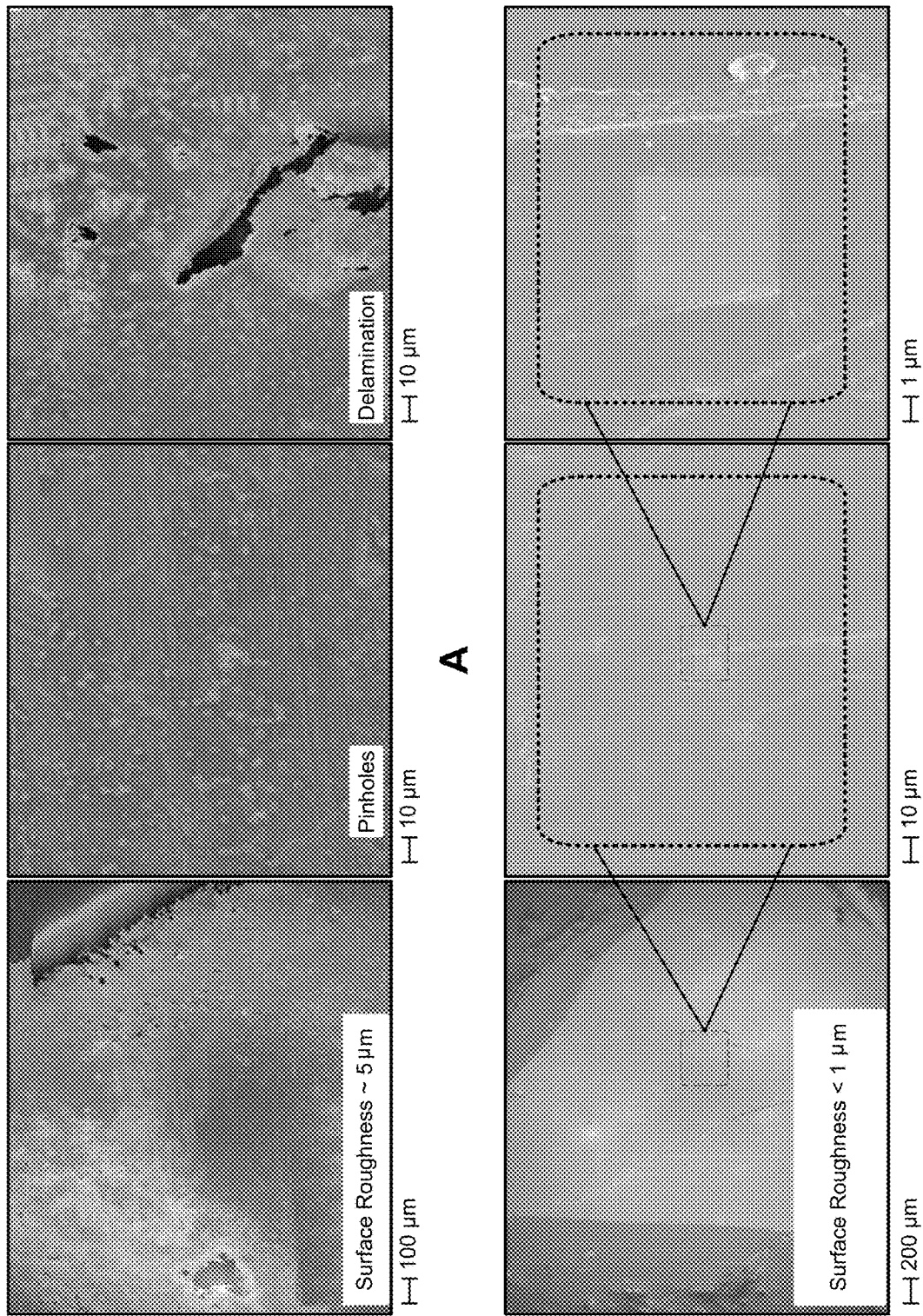
FIG. 4 shows SEM micrographs of an organic solid crystal thin film surface manufactured (A) without a non-volatile medium material and (B) with a non-volatile medium material according to some embodiments.

Turning to FIG. 4, shown are SEM micrographs of molded organic solid crystal thin films formed (A) without a layer of non-volatile medium material, and (B) with a non-volatile medium material pre-disposed over a surface of the mold. In the absence of the non-volatile medium material, as shown by the series of micrographs in FIG. 4A, the organic solid crystal thin film includes pinholes and evidence of mechanical failure (delamination), and has a surface roughness of approximately 5 micrometers. Referring to the series of micrographs in FIG. 4B, on the other hand, the organic solid crystal thin film formed directly over a layer of silicone oil coating an inner surface of the mold is substantially free of pinholes and tears, and has a surface roughness of less than approximately 1 micrometer.

Figure 5:
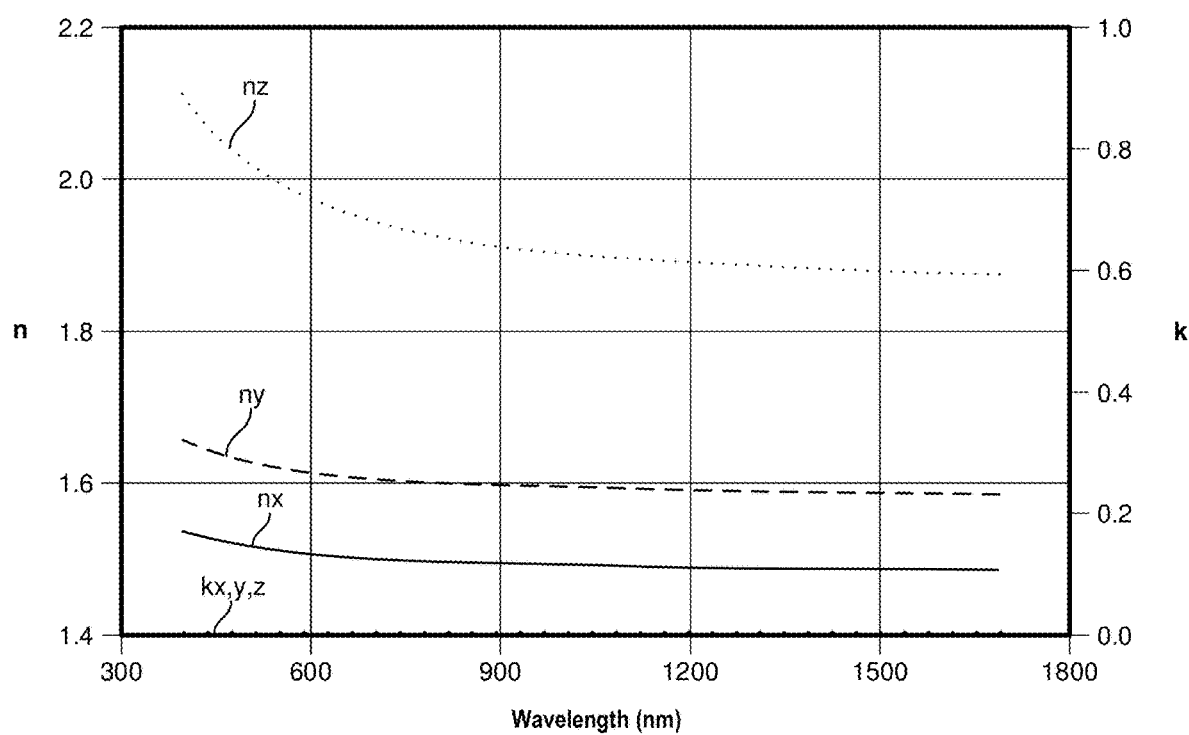
FIG. 5 illustrates the wavelength dependence of example optical properties for the organic solid crystal thin film of FIG. 4B according to some embodiments.

Dispersion curves for the organic solid crystal thin film of FIG. 4B along principal axes (x, y, and z) are shown in FIG. 5. The measured data show that a through thickness refractive index ($n_z$) for the organic solid crystal thin film is greater than 1.8 across the visible spectrum.

Figure 6:
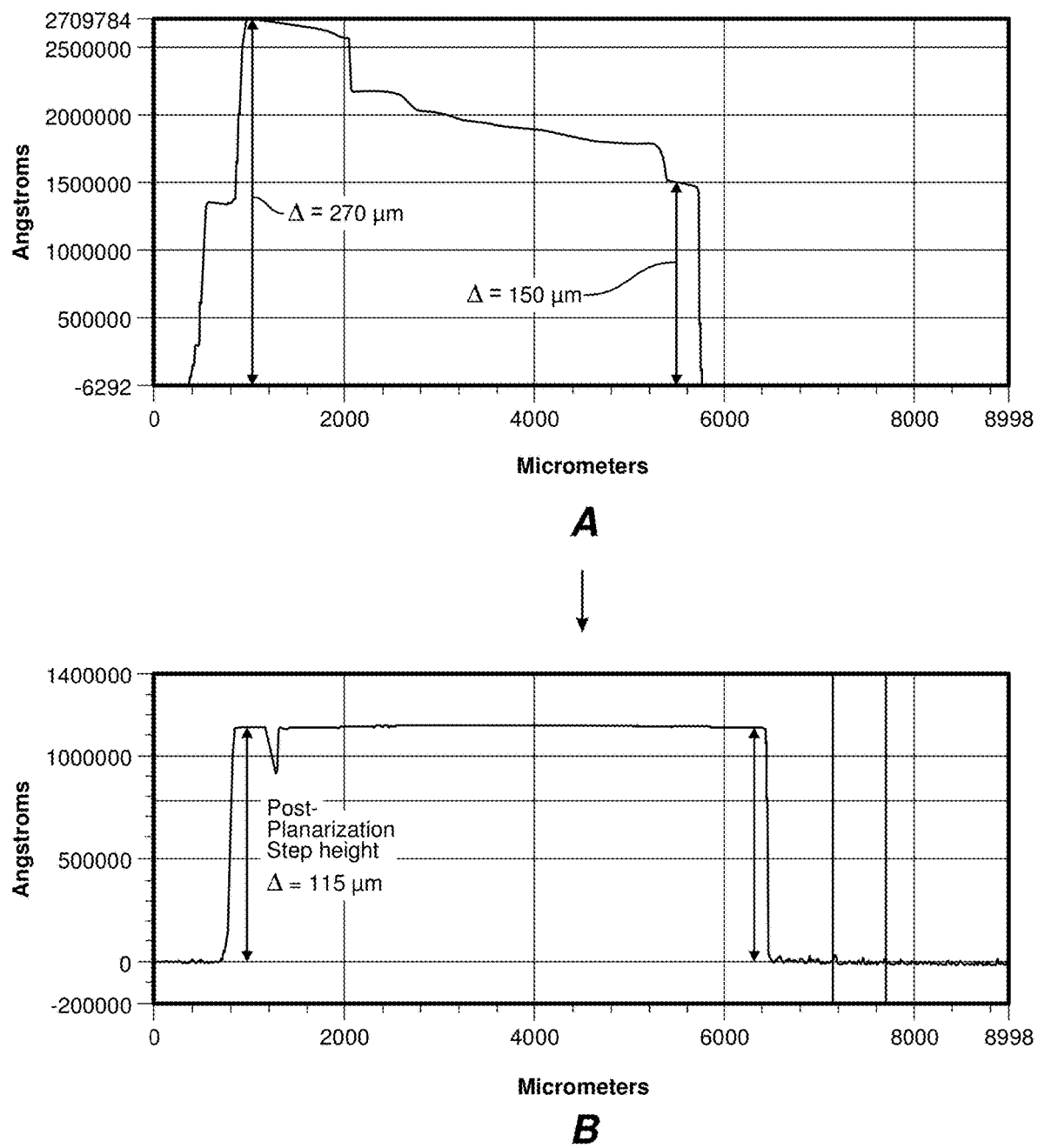
FIG. 6 shows atomic force microscope (AFM) traces for an organic solid crystal thin film (A) before chemical mechanical polishing of a surface of the thin film, and (B) after chemical mechanical polishing according to some embodiments.

Atomic force microscope (AFM) surface profiles showing the effect of chemical mechanical polishing on an anthracene solid crystal are shown in FIG. 6. Referring to FIG. 6A, in a pre-polished sample, the variability in step height thickness for an example surface feature is approximately 130 micrometers. Referring to FIG. 6B, following a planarization step, the variability in step height thickness is decreased significantly, i.e., to within measurement tolerances.

Figure 7:
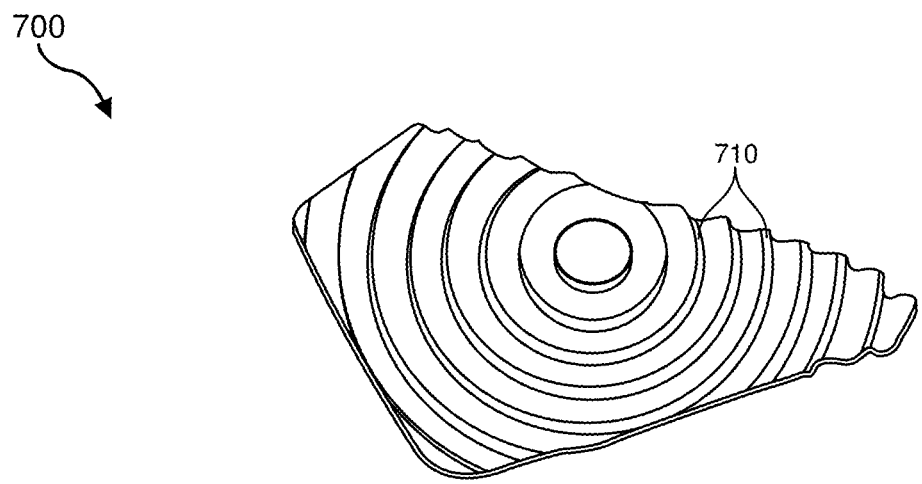
FIG. 7 shows (A) a photomicrograph of a Fresnel lens architecture patterned from an organic solid crystal thin film, and (B) a surface profile of the lens of FIG. 7A according to various embodiments.
Figure 7:
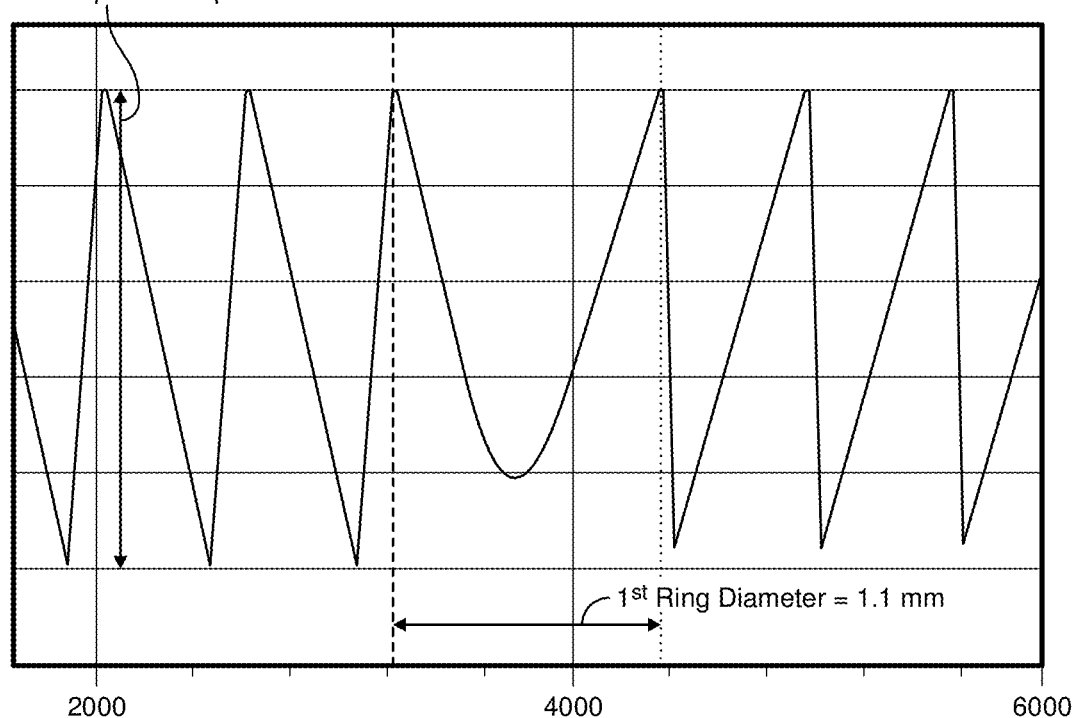

Referring to FIG. 7, shown is a portion of a Fresnel lens architecture formed from an organic solid crystal. Referring to FIG. 7A, lens architecture 700 includes a plurality of circular prismatic features 710. In the illustrated structure, the diameter of the innermost ring is approximately 1.1 mm and the groove depth between neighboring cylindrical features is approximately 250 micrometers. A cross-sectional map showing the feature geometry is shown in FIG. 7B.

Example OSC materials include small molecules, macromolecules, liquid crystals, organometallic compounds, oligomers, and polymers, and may include organic semiconductors such as polycyclic aromatic compounds, e.g., anthracene, phenanthrene, and the like. Methods of manufacturing organic solid crystals may include crystal growth from a melt or solution, chemical or physical vapor deposition, and solvent coating onto a substrate. A deposition surface of the substrate may be treated globally or locally to impact, for example, nucleation density, crystalline orientation, adhesion, surface roughness, etc. The foregoing methods may be applied in conjunction with one or more optional post-deposition steps, such as annealing, polishing, dicing, etc., which may be carried out to improve one or more OSC attributes, including crystallinity, thickness, curvature, and the like.

Disclosed is a method for forming a birefringent organic solid crystal thin film having a high refractive index. In particular embodiments, the method may be used to control the surface roughness of the thin film without the need for post-formation slicing, grinding, and polishing. Using a seed crystal to nucleate an organic solid crystal from a liquid phase containing an organic precursor, in an example method, an organic solid crystal thin film may be cast or molded using a non-volatile medium material (e.g., oil) to template crystal growth.

In some embodiments, an organic precursor may be deposited directly over a layer of a non-volatile medium material, which may provide a smooth interface for the formation of the organic thin film. Thermal processing may be used to induce nucleation and growth of the organic solid crystal phase.

In further embodiments, a mixture containing an organic precursor and a non-volatile medium material may be deposited over a substrate. Thermal processing may be used to induce homogeneous mixing, and subsequent phase separation of the organic precursor and the non-volatile medium material, as well as nucleation and growth of the organic solid crystal phase. During nucleation and growth, according to various embodiments, at least one surface of the thin film may directly contact the non-volatile medium material, which may be effective to mediate molecular-level surface roughness of the nascent organic crystal(s). If provided, a substrate may be patterned to include a 3D structure that is incorporated into the over-formed thin film.

An organic solid crystal thin film may include an organic crystalline phase and may be characterized by a refractive index of at least approximately 1.5 at 589 nm, and a surface roughness (e.g., over an area of at least 1 cm² and independent of surface features such as gratings, etc.) of less than approximately 10 micrometers. The organic solid crystal thin film may be single crystal and may be characterized by three mutually orthogonal refractive indices. Further advantages of the method may include improved processability and lower cost relative to alternate methods.

Example processes may be integrated with a real-time feedback loop that is configured to assess one or more attributes of the organic solid crystal thin film and accordingly adjust one or more process variables, including melt temperature, substrate temperature, draw rate, etc. Resultant organic solid crystal structures may be incorporated into optical elements such as AR/VR headsets and other devices, e.g., waveguides, prisms, Fresnel lenses, and the like.

EXAMPLE EMBODIMENTS

Example 1: An organic thin film includes an organic crystalline phase, where the organic crystalline phase defines a surface having a surface roughness ($R_e$) of less than approximately 10 micrometers over an area of at least approximately 1 cm².

Example 2: The organic thin film of Example 1, where the surface roughness ($R_e$) is less than approximately 1 micrometer.

Example 3: The organic thin film of any of Examples 1 and 2, where a refractive index of the organic crystalline phase along at least one principal axis is at least approximately 1.5 at 589 nm.

Example 4: The organic thin film of any of Examples 1-3, where orthogonal in-plane refractive indices of the organic crystalline phase are each at least approximately 1.5 at 589 nm.

Example 5: The organic thin film of any of Examples 1-4, where an in-plane birefringence of the organic crystalline phase is at least approximately 0.2.

Example 6: The organic thin film of any of Examples 1-4, where an in-plane birefringence of the organic crystalline phase is less than approximately 0.2.

Example 7: The organic thin film of any of Examples 1-6, where an in-plane refractive index of the organic crystalline phase along at least one principal axis is at least approximately 1.8 across the visible spectrum, and an in-plane birefringence of the organic crystalline phase is at least approximately 0.2.

Example 8: The organic thin film of any of Examples 1-7, where the organic crystalline phase constitutes at least approximately 80% of the organic thin film.

Example 9: The organic thin film of any of Examples 1-8, where the surface has a profile selected from planar, convex, and concave.

Example 10: The organic thin film of any of Examples 1-9, where the surface includes a structure selected from a surface relief grating, a microlens, and a prismatic lens.

Example 11: The organic thin film of any of Examples 1-10, further including a substrate underlying the organic crystalline phase.

Example 12: A method includes contacting an organic precursor with a liquid non-volatile medium material, forming a layer comprising the organic precursor within a mold, and processing the organic precursor to form an organic crystalline phase, where the organic crystalline phase defines a surface of an organic thin film having a surface roughness ($R_a$) of less than approximately 10 micrometers over an area of at least approximately 1 cm².

Example 13: The method of Example 12, where contacting the organic precursor with the liquid non-volatile medium material includes forming a homogeneous mixture of the organic precursor and the non-volatile medium material.

Example 14: The method of Example 12, where contacting the organic precursor with the liquid non-volatile medium material includes forming a layer of the organic precursor over a layer of the liquid non-volatile medium material.

Example 15: The method of any of Examples 12-14, where the organic precursor includes a compound selected from anthracene, phenanthrene, diphenylacetylene, stilbene, azobenzene, benzylideneaniline, terphenyl, and thiophene.

Example 16: The method of any of Examples 12-15, where the liquid non-volatile medium material includes a compound selected from silicone oil, a fluorinated polymer, a polyolefin, and polyethylene glycol.

Example 17: The method of any of Examples 12-16, where the mold includes a solid material selected from silicon, silicon dioxide, fused silica, quartz, nickel, silicone, siloxanes, perfluoropolyethers, polytetrafluoroethylenes, perfluoroalkoxy alkanes, polyimide, polyethylene naphthalate, polyvinylidene fluoride, and polyphenylene sulfide.

Example 18: The method of any of Examples 12-17, where processing the organic precursor includes zone annealing the organic precursor within the mold to control crystal content and crystal orientation within the organic crystalline phase.

Example 19: The method of any of Examples 12-18, further including removing the organic thin film from the mold.

Example 20: An optical element includes an organic thin film, the organic thin film includes an organic crystalline phase, where the organic crystalline phase defines a surface having a surface roughness ($R_a$) of less than approximately 10 micrometers over an area of at least approximately 1 cm².

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 800 in FIG. 8) or that visually immerses a user in an artificial reality (e.g., virtual-reality system 900 in FIG. 9). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 8:
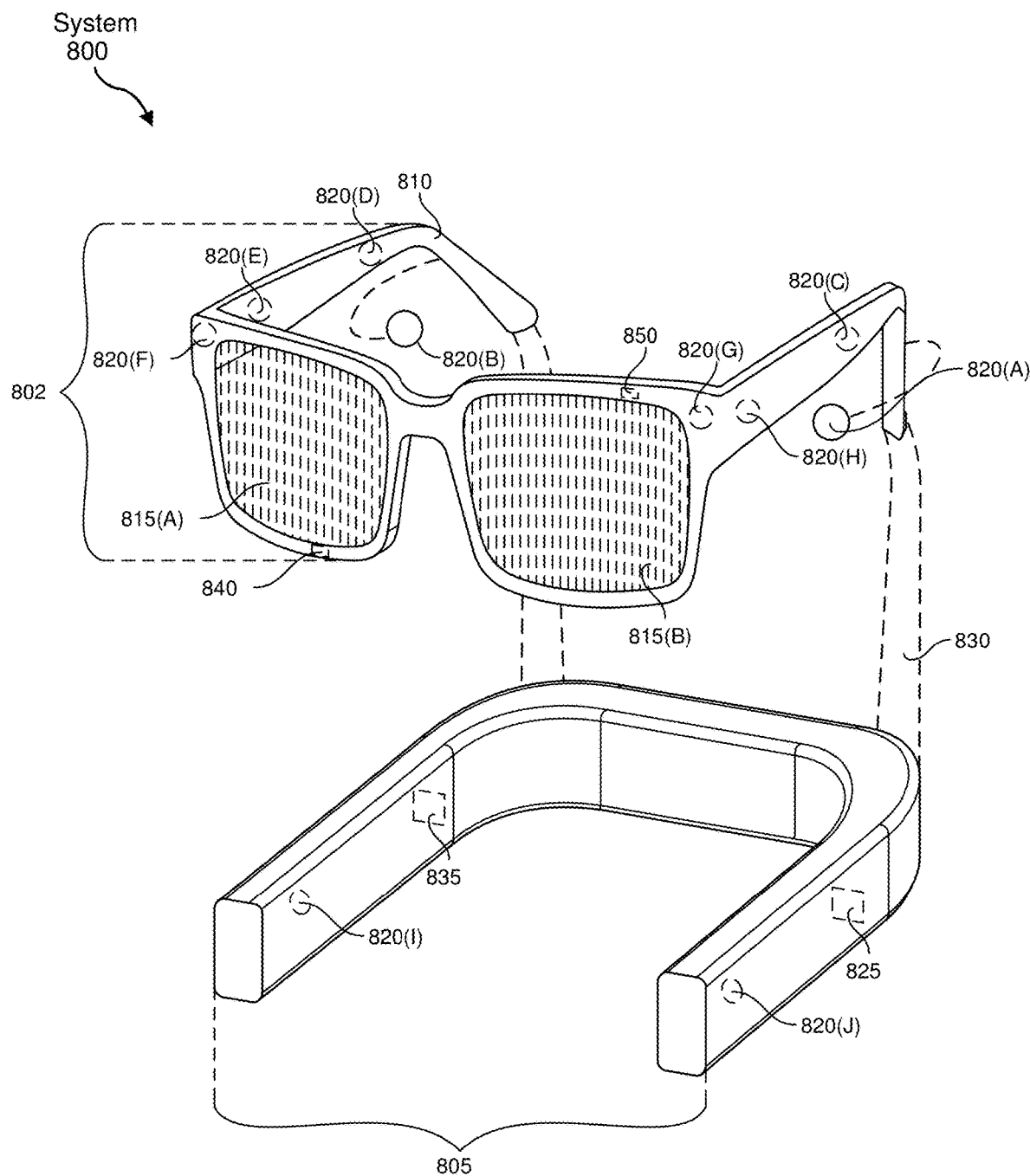
FIG. 8 is an illustration of exemplary augmented-reality glasses that may be used in connection with embodiments of this disclosure.
Figure 9:
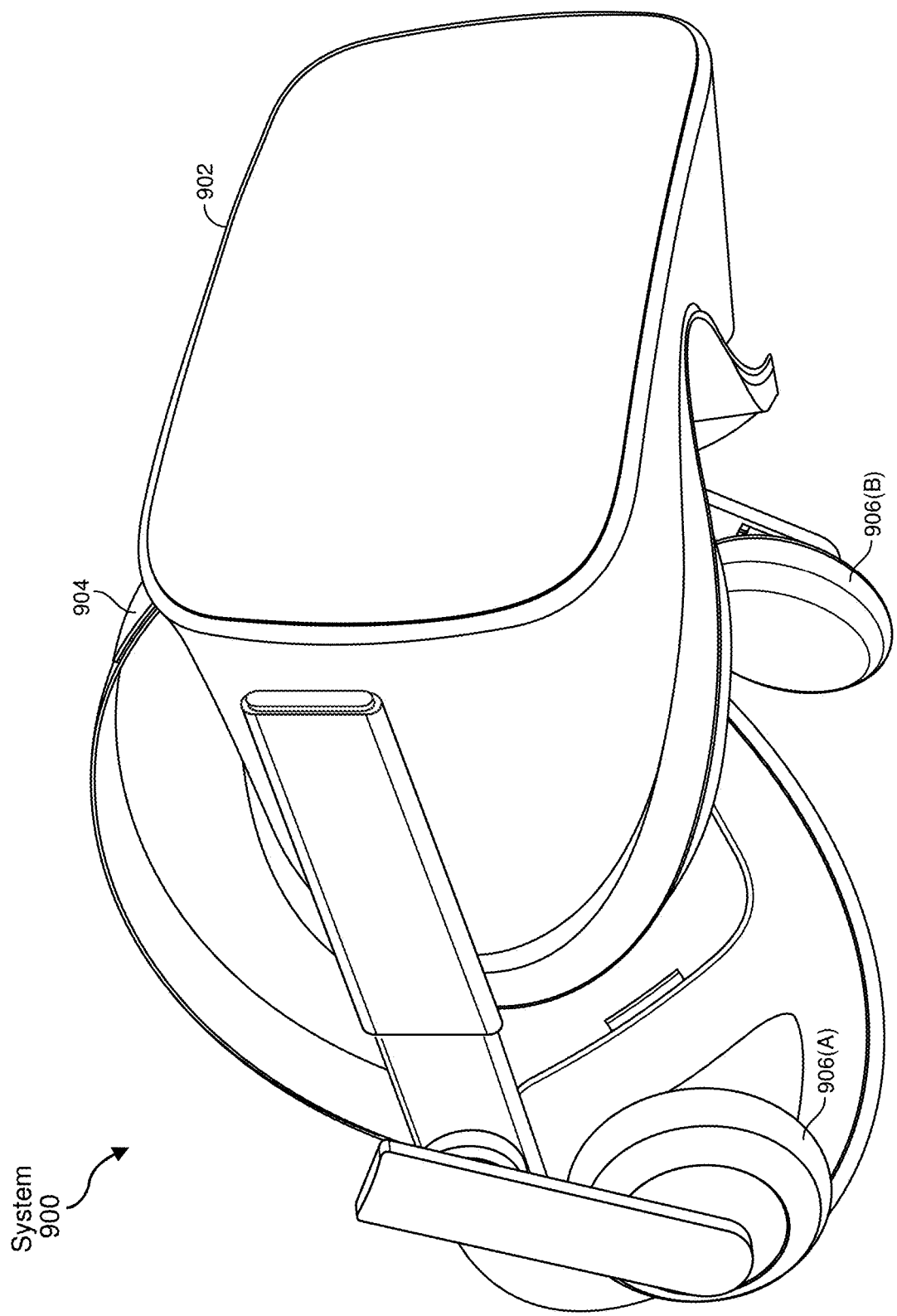
FIG. 9 is an illustration of an exemplary virtual-reality headset that may be used in connection with embodiments of this disclosure.

Turning to FIG. 8, augmented-reality system 800 may include an eyewear device 802 with a frame 810 configured to hold a left display device 815(A) and a right display device 815(B) in front of a user's eyes. Display devices 815(A) and 815(B) may act together or independently to present an image or series of images to a user. While augmented-reality system 800 includes two displays, embodiments of this disclosure may be implemented in augmented-reality systems with a single NED or more than two NEDs.

In some embodiments, augmented-reality system 800 may include one or more sensors, such as sensor 840. Sensor 840 may generate measurement signals in response to motion of augmented-reality system 800 and may be located on substantially any portion of frame 810. Sensor 840 may represent a position sensor, an inertial measurement unit (IMU), a depth camera assembly, a structured light emitter and/or detector, or any combination thereof. In some embodiments, augmented-reality system 800 may or may not include sensor 840 or may include more than one sensor. In embodiments in which sensor 840 includes an IMU, the IMU may generate calibration data based on measurement signals from sensor 840. Examples of sensor 840 may include, without limitation, accelerometers, gyroscopes, magnetometers, other suitable types of sensors that detect motion, sensors used for error correction of the IMU, or some combination thereof.

Augmented-reality system 800 may also include a microphone array with a plurality of acoustic transducers 820(A)-820(J), referred to collectively as acoustic transducers 820. Acoustic transducers 820 may be transducers that detect air pressure variations induced by sound waves. Each acoustic transducer 820 may be configured to detect sound and convert the detected sound into an electronic format (e.g., an analog or digital format). The microphone array in FIG. 8 may include, for example, ten acoustic transducers: 820(A) and 820(B), which may be designed to be placed inside a corresponding ear of the user, acoustic transducers 820(C), 820(D), 820(E), 820(F), 820(G), and 820(H), which may be positioned at various locations on frame 810, and/or acoustic transducers 820(I) and 820(J), which may be positioned on a corresponding neckband 805.

In some embodiments, one or more of acoustic transducers 820(A)-(F) may be used as output transducers (e.g., speakers). For example, acoustic transducers 820(A) and/or 820(B) may be earbuds or any other suitable type of headphone or speaker.

The configuration of acoustic transducers 820 of the microphone array may vary. While augmented-reality system 800 is shown in FIG. 8 as having ten acoustic transducers 820, the number of acoustic transducers 820 may be greater or less than ten. In some embodiments, using higher numbers of acoustic transducers 820 may increase the amount of audio information collected and/or the sensitivity and accuracy of the audio information. In contrast, using a lower number of acoustic transducers 820 may decrease the computing power required by an associated controller 850 to process the collected audio information. In addition, the position of each acoustic transducer 820 of the microphone array may vary. For example, the position of an acoustic transducer 820 may include a defined position on the user, a defined coordinate on frame 810, an orientation associated with each acoustic transducer 820, or some combination thereof.

Acoustic transducers 820(A) and 820(B) may be positioned on different parts of the user's ear, such as behind the pinna, behind the tragus, and/or within the auricle or fossa. Or, there may be additional acoustic transducers 820 on or surrounding the ear in addition to acoustic transducers 820 inside the ear canal. Having an acoustic transducer 820 positioned next to an ear canal of a user may enable the microphone array to collect information on how sounds arrive at the ear canal. By positioning at least two of acoustic transducers 820 on either side of a user's head (e.g., as binaural microphones), augmented-reality device 800 may simulate binaural hearing and capture a 3D stereo sound field around about a user's head. In some embodiments, acoustic transducers 820(A) and 820(B) may be connected to augmented-reality system 800 via a wired connection 830, and in other embodiments acoustic transducers 820(A) and 820(B) may be connected to augmented-reality system 800 via a wireless connection (e.g., a Bluetooth connection). In still other embodiments, acoustic transducers 820(A) and 820(B) may not be used at all in conjunction with augmented-reality system 800.

Acoustic transducers 820 on frame 810 may be positioned along the length of the temples, across the bridge, above or below display devices 815(A) and 815(B), or some combination thereof. Acoustic transducers 820 may be oriented such that the microphone array is able to detect sounds in a wide range of directions surrounding the user wearing the augmented-reality system 800. In some embodiments, an optimization process may be performed during manufacturing of augmented-reality system 800 to determine relative positioning of each acoustic transducer 820 in the microphone array.

In some examples, augmented-reality system 800 may include or be connected to an external device (e.g., a paired device), such as neckband 805. Neckband 805 generally represents any type or form of paired device. Thus, the following discussion of neckband 805 may also apply to various other paired devices, such as charging cases, smart watches, smart phones, wrist bands, other wearable devices, hand-held controllers, tablet computers, laptop computers, other external compute devices, etc.

As shown, neckband 805 may be coupled to eyewear device 802 via one or more connectors. The connectors may be wired or wireless and may include electrical and/or non-electrical (e.g., structural) components. In some cases, eyewear device 802 and neckband 805 may operate independently without any wired or wireless connection between them. While FIG. 8 illustrates the components of eyewear device 802 and neckband 805 in example locations on eyewear device 802 and neckband 805, the components may be located elsewhere and/or distributed differently on eyewear device 802 and/or neckband 805. In some embodiments, the components of eyewear device 802 and neckband 805 may be located on one or more additional peripheral devices paired with eyewear device 802, neckband 805, or some combination thereof.

Pairing external devices, such as neckband 805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 800 may be provided by a paired device or shared between a paired device and an eyewear device, thus reducing the weight, heat profile, and form factor of the eyewear device overall while still retaining desired functionality. For example, neckband 805 may allow components that would otherwise be included on an eyewear device to be included in neckband 805 since users may tolerate a heavier weight load on their shoulders than they would tolerate on their heads. Neckband 805 may also have a larger surface area over which to diffuse and disperse heat to the ambient environment. Thus, neckband 805 may allow for greater battery and computation capacity than might otherwise have been possible on a stand-alone eyewear device. Since weight carried in neckband 805 may be less invasive to a user than weight carried in eyewear device 802, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 805 may be communicatively coupled with eyewear device 802 and/or to other devices. These other devices may provide certain functions (e.g., tracking, localizing, depth mapping, processing, storage, etc.) to augmented-reality system 800. In the embodiment of FIG. 8, neckband 805 may include two acoustic transducers (e.g., 820(1) and 820(J)) that are part of the microphone array (or potentially form their own microphone subarray). Neckband 805 may also include a controller 825 and a power source 835.

Acoustic transducers 820(1) and 820(J) of neckband 805 may be configured to detect sound and convert the detected sound into an electronic format (analog or digital). In the embodiment of FIG. 8, acoustic transducers 820(1) and 820(J) may be positioned on neckband 805, thereby increasing the distance between the neckband acoustic transducers 820(1) and 820(J) and other acoustic transducers 820 positioned on eyewear device 802. In some cases, increasing the distance between acoustic transducers 820 of the microphone array may improve the accuracy of beamforming performed via the microphone array. For example, if a sound is detected by acoustic transducers 820(C) and 820(D) and the distance between acoustic transducers 820(C) and 820(D) is greater than, e.g., the distance between acoustic transducers 820(D) and 820(E), the determined source location of the detected sound may be more accurate than if the sound had been detected by acoustic transducers 820(D) and 820(E).

Controller 825 of neckband 805 may process information generated by the sensors on neckband 805 and/or augmented-reality system 800. For example, controller 825 may process information from the microphone array that describes sounds detected by the microphone array. For each detected sound, controller 825 may perform a direction-of-arrival (DOA) estimation to estimate a direction from which the detected sound arrived at the microphone array. As the microphone array detects sounds, controller 825 may populate an audio data set with the information. In embodiments in which augmented-reality system 800 includes an inertial measurement unit, controller 825 may compute all inertial and spatial calculations from the IMU located on eyewear device 802. A connector may convey information between augmented-reality system 800 and neckband 805 and between augmented-reality system 800 and controller 825. The information may be in the form of optical data, electrical data, wireless data, or any other transmittable data form. Moving the processing of information generated by augmented-reality system 800 to neckband 805 may reduce weight and heat in eyewear device 802, making it more comfortable to the user.

Power source 835 in neckband 805 may provide power to eyewear device 802 and/or to neckband 805. Power source 835 may include, without limitation, lithium ion batteries, lithium-polymer batteries, primary lithium batteries, alkaline batteries, or any other form of power storage. In some cases, power source 835 may be a wired power source. Including power source 835 on neckband 805 instead of on eyewear device 802 may help better distribute the weight and heat generated by power source 835.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 900 in FIG. 9, that mostly or completely covers a user's field of view. Virtual-reality system 900 may include a front rigid body 902 and a band 904 shaped to fit around a user's head. Virtual-reality system 900 may also include output audio transducers 906(A) and 906(B). Furthermore, while not shown in FIG. 9, front rigid body 902 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 800 and/or virtual-reality system 900 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 800 and/or virtual-reality system 900 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 800 and/or virtual-reality system 900 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 9, output audio transducers 906(A) and 906(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 8, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a non-volatile medium material that comprises or includes paraffin oil include embodiments where a non-volatile medium material consists essentially of paraffin oil and embodiments where a non-volatile medium material consists of paraffin oil.

What is claimed is:

1. An organic thin film comprising an organic crystalline phase, wherein the organic crystalline phase is derived from a liquid non-volatile medium material comprising a compound selected from the group consisting of silicone oil, a fluorinated polymer, a polyolefin, and polyethylene glycol, and the organic crystalline phase defines a surface having a surface roughness ($R_a$) of less than approximately 10 micrometers over an area of at least approximately 1 $cm^2$.

2. The organic thin film of claim 1, wherein the surface roughness ($R_a$) is less than approximately 1 micrometer.

3. The organic thin film of claim 1, wherein a refractive index of the organic crystalline phase along at least one principal axis is at least approximately 1.7 at 589 nm.

4. The organic thin film of claim 1, wherein orthogonal in-plane refractive indices of the organic crystalline phase are each at least approximately 1.7 at 589 nm.

5. The organic thin film of claim 1, wherein an in-plane birefringence of the organic crystalline phase is at least approximately 0.2.

6. The organic thin film of claim 1, wherein an in-plane birefringence of the organic crystalline phase is less than approximately 0.2.

7. The organic thin film of claim 1, wherein:
an in-plane refractive index of the organic crystalline phase along at least one principal axis is at least approximately 1.8 across the visible spectrum, and
an in-plane birefringence of the organic crystalline phase is at least approximately 0.2.

8. The organic thin film of claim 1, wherein the organic crystalline phase comprises at least approximately 80% of the organic thin film.

9. The organic thin film of claim 1, wherein the surface comprises a profile selected from the group consisting of planar, convex, and concave.

10. The organic thin film of claim 1, wherein the surface comprises a structure selected from the group consisting of a surface relief grating, a microlens, and a prismatic lens.

11. The organic thin film of claim 1, further comprising a substrate underlying the organic crystalline phase.

12. A method comprising:
contacting an organic precursor with a liquid non-volatile medium material to form a homogeneous mixture of the organic precursor and the non-volatile medium material;
forming a layer comprising the organic precursor within a mold; and
processing the organic precursor to form an organic crystalline phase, wherein the organic crystalline phase defines a surface of an organic thin film having a surface roughness ($R_a$) of less than approximately 10 micrometers over an area of at least approximately 1 $cm^2$.

13. The method of claim 12, wherein contacting the organic precursor with the liquid non-volatile medium material comprises forming a layer of the organic precursor over a layer of the liquid non-volatile medium material.

14. The method of claim 12, wherein the organic precursor comprises a compound selected from the group consisting of anthracene, phenanthrene, diphenylacetylene, stilbene, azobenzene, benzylideneaniline, terphenyl, and thiophene.

15. The method of claim 12, wherein the liquid non-volatile medium material comprises a compound selected from the group consisting of silicone oil, a fluorinated polymer, a polyolefin, and polyethylene glycol.

16. The method of claim 12, wherein the mold comprises a solid material selected from the group consisting of silicon, silicon dioxide, fused silica, quartz, nickel, silicone, siloxanes, perfluoropolyethers, polytetrafluoroethylenes, perfluoroalkoxy alkanes, polyimide, polyethylene naphthalate, polyvinylidene fluoride, and polyphenylene sulfide.

17. The method of claim 12, wherein processing the organic precursor comprises zone annealing the organic precursor within the mold to control crystal content and crystal orientation within the organic crystalline phase.

18. The method of claim 12, further comprising removing the organic thin film from the mold.

19. An optical element comprising an organic thin film, the organic thin film comprising an organic crystalline phase, wherein the organic crystalline phase is derived from a liquid non-volatile medium material comprising a compound selected from the group consisting of silicone oil, a fluorinated polymer, a polyolefin, and polyethylene glycol, and the organic crystalline phase defines a surface having a surface roughness ($R_a$) of less than approximately 10 micrometers over an area of at least approximately 1 $cm^2$.

* * * * *